US012400723B2

United States Patent
Yu et al.

(10) Patent No.: US 12,400,723 B2
(45) Date of Patent: Aug. 26, 2025

(54) LATCH TYPE SENSE AMPLIFIER FOR TESTING

(71) Applicant: TAIWAN SEMICONDUCTOR MANUFACTURING COMPANY, LTD., Hsinchu (TW)

(72) Inventors: Hua-Hsin Yu, Hsinchu (TW); Hau-Tai Shieh, Hsinchu (TW); Cheng Hung Lee, Hsinchu County (TW); Hung-Jen Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 196 days.

(21) Appl. No.: 18/155,547

(22) Filed: Jan. 17, 2023

(65) Prior Publication Data

US 2024/0242772 A1    Jul. 18, 2024

(51) Int. Cl.
*G11C 29/02* (2006.01)
*G11C 29/12* (2006.01)
*G11C 29/14* (2006.01)

(52) U.S. Cl.
CPC ........ *G11C 29/026* (2013.01); *G11C 29/1201* (2013.01); *G11C 29/14* (2013.01)

(58) Field of Classification Search
CPC ... G11C 29/026; G11C 29/1201; G11C 29/14; G11C 29/021; G11C 29/028; G11C 2029/1204
See application file for complete search history.

(56) References Cited

U.S. PATENT DOCUMENTS

| | | | |
|---|---|---|---|
| 11,935,606 B2* | 3/2024 | Sahu | G11C 29/24 |
| 2011/0225475 A1* | 9/2011 | Kumar | G11C 8/16 |
| | | | 714/763 |

* cited by examiner

*Primary Examiner* — Sultana Begum
(74) *Attorney, Agent, or Firm* — Maschoff Brennan (57) ABSTRACT

A device is provided and includes a sense amplifier and an output latch circuit. The sense amplifier adjusts voltage levels of first and second data lines according to a bypass data signal corresponding to a data signal in response to a first enable signal having a first logic state and a second enable signal having a second logic state different from the first logic state during a test mode. The output latch circuit generates a data output signal according to the voltage level of the first data line in response to the first enable signal having the second logic state and a third enable signal having the first logic state during the test mode.

20 Claims, 6 Drawing Sheets

LATCH TYPE SENSE AMPLIFIER FOR TESTING

BACKGROUND

Scan chain is one example of a technique implemented in a Design-for-Testing or Design for Testability ("DFT") process that refers to integrated circuit design techniques adding certain testability features to a hardware product design. The DFT features make it easier to develop and apply various manufacturing tests for the designed hardware. The purpose of manufacturing tests is to validate that the hardware products contain no manufacturing defects that could adversely affect the product's proper functioning.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

In some approaches, test patterns (e.g., binary vectors) are applied as SI inputs to a DFT circuit. Additionally, functional clock signals (e.g., pulses) are sent to the DFT circuit for controlling and timing operation in the test mode. The results of a test are then shifted out via chip output pins and compared against the expected results. Conventionally, application of scan techniques as described above demands a large amount of memory and test time, and produces large vector sets.

In some embodiments of the present application, a sense amplifier cooperates with the data output latch circuit (e.g., referred to a Q latch) for generating the result of the test in the test mode, instead of being idle according to some approaches. Accordingly, additional shadow latch circuit applied for shifting test pattern in the test mode is eliminated from the DFT circuit, and area management and power consumption of the integrated circuit are optimized, compared with some approaches.

Figure 1:
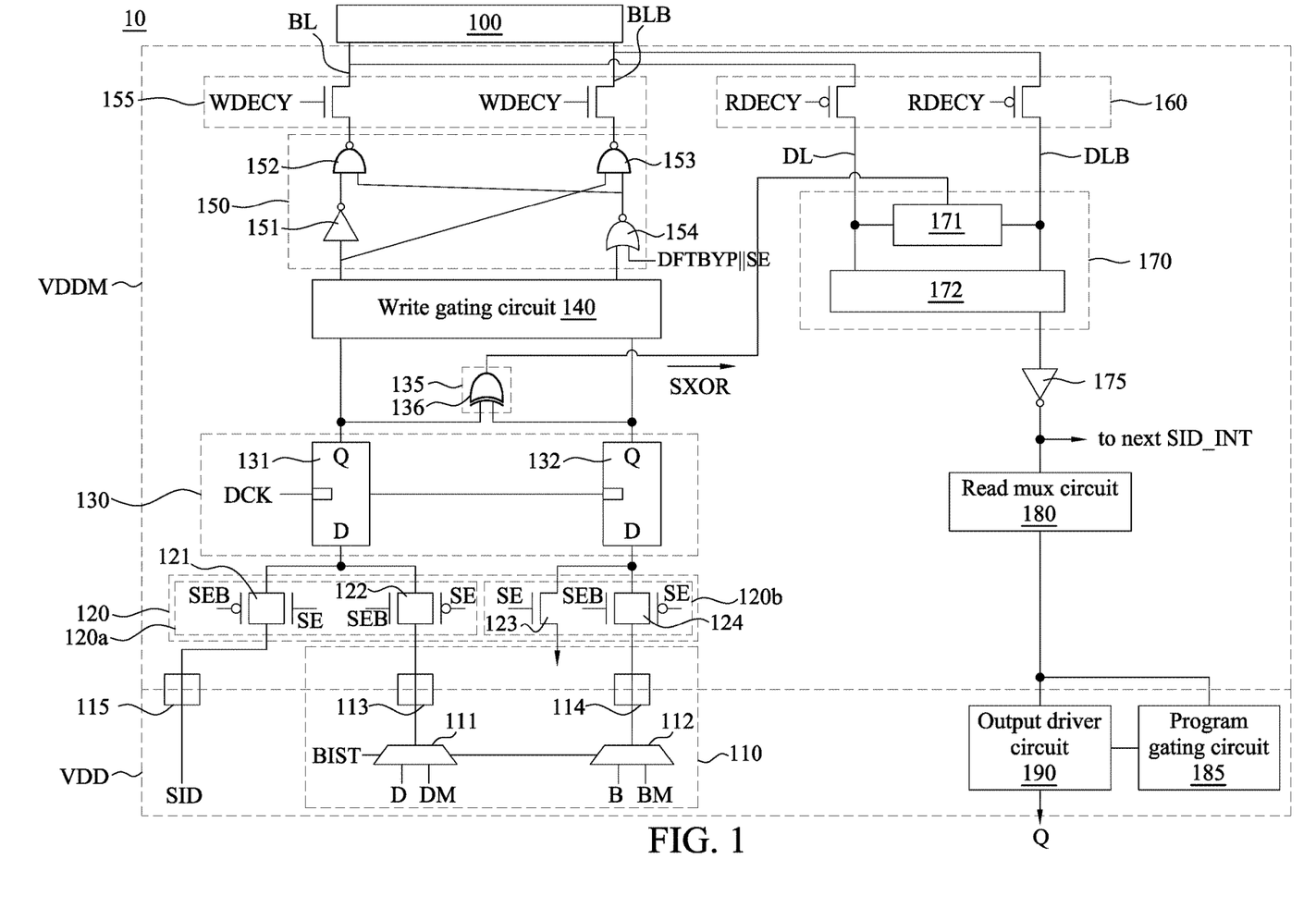
FIG. 1 is a schematic diagram of a memory device, in accordance with some embodiments of the present disclosure.

Reference is now made to FIG. 1. FIG. 1 is a schematic diagram of a memory device 10, in accordance with some embodiments of the present disclosure. In some embodiments, the memory device 10 is referred to as a scan design for testability (DFT) circuit that includes certain testability features to a hardware product design and provides a simple way to set and observe every latch in an integrated circuit (IC).

For illustration, the memory device 10 includes a bit cell portion having a memory array 100, an input portion having a built-in self-test circuit 110, a DFT multiplexer 120, a write latch circuit 130, a bypass circuit 135, and a write gating circuit 140, a memory core logic portion including a write circuit 150, a write column select circuit 155, a read column select circuit 160, and a read circuit 170, and an output portion having a read mux circuit 180, a program gating circuit 185, and a output driver circuit 190. In some embodiments, the built-in self-test circuit 110, the program gating circuit 185, and the output driver circuit 190 operate in a power domain providing a supply voltage VDD, and the DFT multiplexer 120, the write latch circuit 130, the bypass circuit 135, the write gating circuit 140, the write circuit 150, the write column select circuit 155, the read column select circuit 160, the read circuit 170, the inverter 175, and the read mux circuit 180 operate in another power domain providing a supply voltage VDDM different from the supply voltage VDD. In various embodiments, the supply voltage VDDM is smaller than the supply voltage VDD. In some embodiments, the memory array 100 includes multiple memory (bit) cells operating as storage units, each capable of storing or recording a single bit of data (e.g., a 1 or 0).

In some embodiments, the memory device 10 has different modes of operation, including a NORMAL mode (e.g., read and write mode) and a (DFT) test mode (e.g., a SHIFT mode, and a CAPTURE mode), while the SHIFT mode includes two sub-modes referred to as SCAN and DEBUG.

In the NORMAL mode, the memory device 10 does not perform any testing; instead, the memory device 10 performs its regular functionality that it is designed to perform, such as enabling reading and writing of data from/to a memory, e.g., a static random access memory (SRAM). In some embodiments, a NORMAL path proceeds through the input portion, the memory core logic portion and then the output portion. Specifically, for example, the NORMAL path proceeds through the built-in self-test circuit 110, the DFT multiplexer 120, the write latch circuit 130, the bypass circuit 135, the write gating circuit 140, the write circuit 150, the write column select circuit 155, the memory array 100 in the write mode, and through the memory array 100, the read column select circuit 160, the read circuit 170, the read mux circuit 180, the program gating circuit 185, and the output driver circuit 190 in read mode.

In the SHIFT and CAPTURE modes, test-related features are invoked, and various testing functionality is performed on the memory device 10 by applying certain input data (for example, a data signal SID during the SHIFT mode and a data signal D during the CAPTURE mode in FIG. 1 inputted) to the memory device 10 and comparing an output data (e.g., an output signal Q in FIG. 1) with "designed" output data that the memory device 10 is designed to produce. If the observed output matches the "designed" output then the memory device 10 passes the test; if the observed output does not match the "designed" output, the memory device 10 fails the test. In SHIFT mode and CAPTURE mode, which can be considered as test modes, tests are performed on different parts of the memory device 10.

In some embodiments, a CAPTURE path and a SHIFT path both pass through the input portion and proceed through the memory core logic portion, and then to the output portion. Specifically, for example, both of the CAPTURE path and the SHIFT path proceed through the read circuit 170 in the memory core logic portion. The details of configurations and operations will be discussed in the following paragraphs.

As illustratively shown in FIG. 1, the built-in self-test circuit 110 includes multiplexers 111-112 and level shifters 113-114. The multiplexer 111 is configured to output one of signals D and DM in response to a signal BIST, and the multiplexer 112 is configured to output one of signals B and BM in response to the signal BIST. The level shifters 113 and 114 are configured to shift amplitudes of the signals output from the multiplexers 111-112 to a desired level (e.g., shifting from the power domain VDD to the power domain VDDM).

The DFT multiplexer 120 includes transmission gates 121-122, 124 and a transistor 123. In some embodiments, the transmission gates 121-122 are configured to be a multiplexer 120a, and the transistor 123 and the transmission gate 124 are configured to be a multiplexer 120b. The data signal SID is transmitted to the multiplexer 120a through the level shifter 115, which shifts levels of the data signal SID to a desired output signal level in accordance with system requirements. In some embodiments, the data signal SID is referred to as a shift-in data. The multiplexer 111 is coupled to an input of the multiplexer 120a through the level shifter 113. The multiplexer 112 is coupled to an input of the multiplexer 120b through the level shifter 114.

The write latch circuit 130 includes latch circuits 131-132. A D input of the latch circuit 131 is connected to the output of multiplexer 120a. The D input of the latch circuit 132 is connected to the output of multiplexer 120b. Selectors of the latch circuit 131 are connected together as shown and connected to a control signal line (not shown). In some embodiments, the latch circuits 131-132 are low-pass latch circuits which allow data to pass through when the clock phase is low (e.g., low logic state, "0".) In various embodiments, the latch circuits 131-132 are shared among the NORMAL, SHIFT and CAPTURE modes and paths.

The bypass circuit 135 includes an exclusive OR (XOR) gate with two inputs coupled between the output of the multiplexers 120a-120b and the write gating circuit 140. An output of the bypass circuit 135 is coupled to the read circuit 170 to transmit a bypass data signal SXOR to the sense amplifier 171 of the read circuit 170.

The write gating circuit 140 is coupled between the write latch circuit 130 and the write circuit 150. The write circuit 150 includes an inverter 151, NAND gates 152-153, and a NOR gate 154. The NAND gate 152 has two inputs connected to the output of inverter 151 and the output of NOR gate 154, respectively. The NAND gate 153 has two inputs connected to the output of the NOR gate 154 and the input of inverter 151, respectively. The outputs of NAND gates 152 and 153 are coupled to the sense amplifier 171 through the write column select circuit 155, bit lines BL, BLB, the read column select circuit 160, and data lines DL and DLB. The write column select circuit 155 includes transistors turned on in response to a write column selector signal WDECY for accessing memory cells in the memory array 100 coupled to the bit lines BL and BLB. The read column select circuit 160 includes transistors turned on in response to a read column selector signal RDECY for accessing memory cells in the memory array 100 coupled to the bit lines BL and BLB.

In some embodiments, the write gating circuit 140 and the NOR gate 154 are implemented to support NORMAL/SHIFT/CAPTURE mode selection. Specifically, the NOR gate 154 is controlled by a selector signal designated as DFTBYP∥SE. Alternatively stated, the mode and path selection among NORMAL/SHIFT/CAPTURE is controlled by the value of the selector signal DFTBYP∥SE. "DFTBYP" stands for Design-For-Testing-Bypass, and "SE" stands for Shift-Enabled. DFTBYP∥SE signifies a result of an OR logic operation of the signals DFTBYP and SE. In some embodiments, when the signal SE is asserted, every latch in the memory device 10 is connected to a respective bit of a shift register. And the signal DFTBYP enables the memory device 10 into "CAPTURE mode," as SE is not asserted.

In some embodiments, the write gating circuit 140 includes a first multiplexer coupled between the output of the latch circuit 131 and the inverter 151 and a second multiplexer coupled between the output of the latch circuit 132 and an input of the NOR gate 154.

The read circuit 170 includes the sense amplifier 171 and an output latch circuit 172. In some embodiments, the output latch circuit 172 is implemented as a high-pass latch circuit that allows data to pass through when the clock phase is high (e.g., high logic state, "1".) The sense amplifier 171 is configured to sensing signals from respective bit-lines BL and BLB through the data lines DL and DLB that represent data bits (1 or 0) stored in respective memory cells, and to amplify the small voltage swing to recognizable logic levels so the data can be interpreted properly by logic circuitry coupled to the memory. The output latch circuit 172 is configured to latch the read data from the output latch circuit 172 and output to the read mux circuit 180 and further to the output driver circuit 190 in response to an enable control signal PM from the program gating circuit 185. The output driver circuit 190 is configured to generate the output signal Q.

With continued reference to FIG. 1, in NORMAL mode (for example, the write mode) according to some embodiments, the signals D and DM of the multiplexer 111 are transmitted to the multiplexer 120a through the level shifter 113, and the signals B and BM of the multiplexer 112 are transmitted to the multiplexer 120b through the level shifter 114. Both the multiplexers 120a and 120b are controlled by a selector signal HIT and the signal SE (e.g., HIT has a low logic state in NORMAL mode, and SE stands for Shift Enable). Depending on the settings of the signals HIT and SE, the data signal D (e.g., referred to as a write data signal) or DM from the multiplexer 111 and the signal B or BM from the multiplexer 112 are transmitted as output signals to the D inputs of the latch circuits 131 and 132, respectively. The output of the latch circuits 131 and 132 are then transmitted to the write gating circuit 140 as discussed above. The outputs of write gating circuit 140 are then transmitted to the input of the inverter 151, a first input of the NAND gate 153, a first input of the NOR gate 154. The output of the NOR gate 154 is provided to the second inputs of NAND gates 152 and 153, respectively. The outputs of NAND gate 152 and 153 are provided to the memory array 100 for storage during a write operation (NORMAL mode). During the read mode of NORMAL, the sense amplifier 171 provides the read out data from the memory array 100 to the output latch circuit 172 for temporary storage of data. The signal passes through the read mux circuit 180 and then passes through the output driver circuit 190.

In the CAPTURE mode of the DFT test mode, as the signal SE has a low logic state, the data signal D is outputted to a first input of the bypass circuit 135 through the multiplexer 111, the level shifter 113, the multiplexer 120a, and the latch circuit 131. The signal B or BM is outputted to the latch circuit 132 for generating a write enable signal BWEB to a second input of the bypass circuit 135. The data of the data signal D is further latched in the read circuit 170 and read out as the output signal Q. In some embodiments, the signals B and BM are programmed for performing testing.

During the SHIFT mode of the DFT test mode, as the signal SE has a high logic state to turn on the transmission gate 121, the data signal SID is provided to the multiplexer 120a through the level shifter 115. The output of the multiplexer 120a, which is controlled by the signals SE and SEB (inverted from the signal SE), as discussed above, is then provided to latch circuit 131, which then outputs a signal to a first input of the bypass circuit 135. Correspondingly, the bypass data signal SXOR generated by the bypass circuit 135 passes to the sense amplifier 171. The sense amplifier 171 provides a data signal corresponding to the data signal SID to the output latch circuit 172 for temporary storage of test data.

In some embodiments, a system includes multiple memory devices 10 that sequentially coupled with each other, in which a first memory device 10 receives a data signal (referred to as a data signal SID_EXT inputted as the data signal SID of FIG. 1) from external test device and a read out data (e.g., a signal generated by the inverter 175 in FIG. 1) from the first memory device 10 is transmitted as the data signal SID_INT (inputted as the data signal SID of FIG. 1) to a following memory device 10, and so on. The detailed configurations of the DFT test mode will be discussed in the following paragraphs with reference to FIGS. 2-6.

The configurations of FIG. 1 are given for illustrative purposes. Various implements are within the contemplated scope of the present disclosure. For example, in some embodiments, the inverter 175 is included in the read circuit 170.

Figure 2:
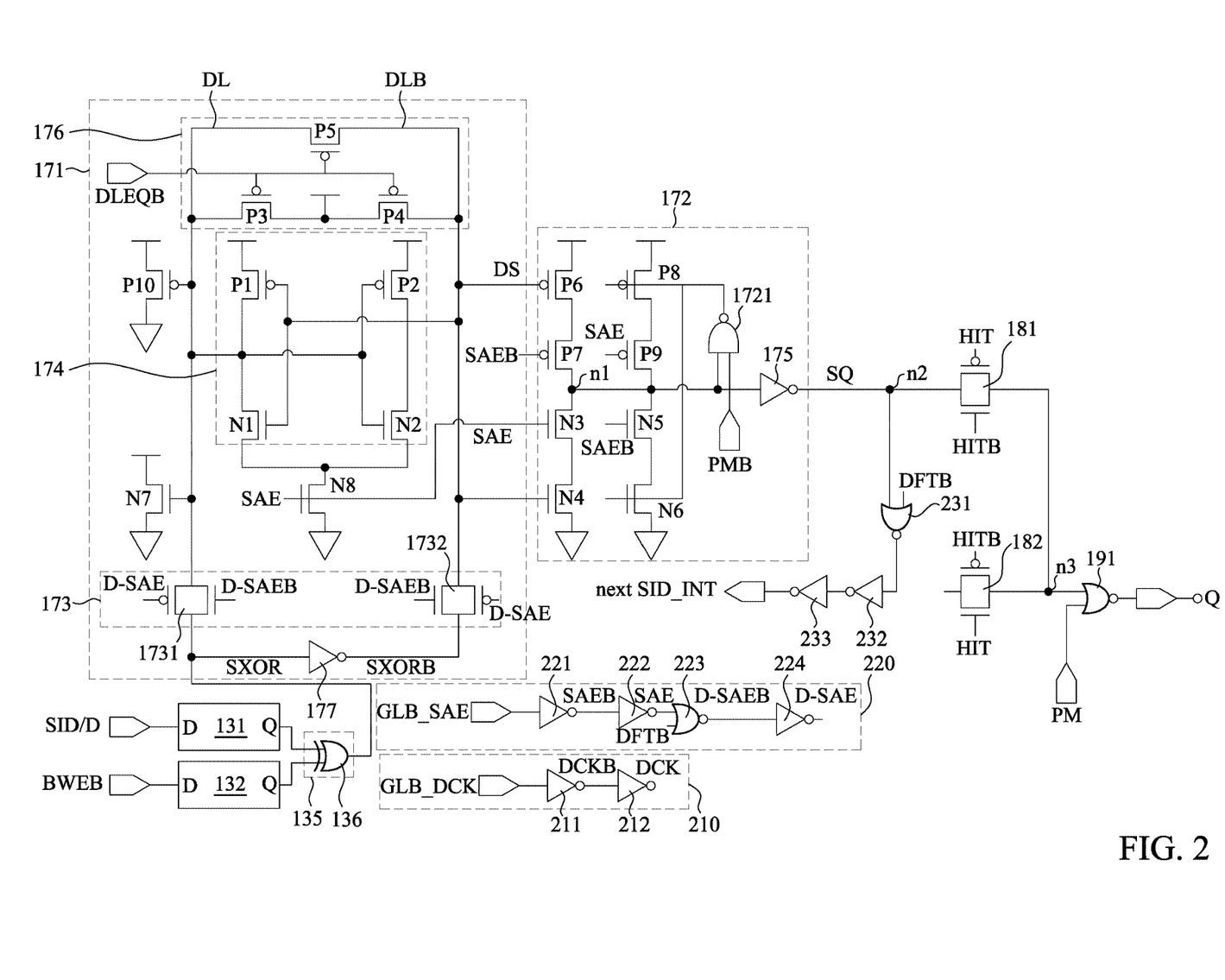
FIG. 2 is a detailed schematic diagram of the memory device of FIG. 1, in accordance with some embodiments of the present disclosure.

Reference is now made to FIG. 2. FIG. 2 is a detailed schematic diagram of the memory device 10 of FIG. 1, in accordance with some embodiments of the present disclosure.

The low-pass latch circuits 131-132 are configured to transmit signals corresponding to the data signal SID or the data signal D and the write enable signal BWEB to the bypass circuit 135. In some embodiments, BWEB stands for Bit-Write-Enabled-Bar function which performs logical inversion of enabling a bit write signal.

The bypass circuit 135 includes the exclusive OR gate 136 configured to generate the bypass data signal SXOR according to the data signal SID or the data signal D and the write enable signal BWEB.

In some embodiments, the sense amplifier 171 includes a read gating circuit 173, a latch circuit 174, a precharge circuit 176, and an inverter 177 having a terminal coupled to the bypass circuit 135. For illustration, the read gating circuit 173 is coupled between the data lines DL and DLB, the bypass circuit 135, and an inverter 177 of the sense amplifier 171. The read gating circuit 173 includes a transmission gate 1731 that is coupled to the data line DL, a terminal of the inverter 177, and the output of the exclusive OR gate 136 in the bypass circuit 135 and configured to transmit the bypass data signal SXOR from the exclusive OR gate 136 to the data line DL in response to enable signals D-SAE and D-SAEB. The other transmission gate 1732 in the read gating circuit 173 is coupled to the data line DLD, another terminal of the inverter 177 and configured to transmit an inverted bypass data signal SXORB from the inverter 177 to the data line DLB in response to the enable signals D-SAE and D-SAEB. Each of the transmission gates 1731-1732 is composed of one P-type transistor and one N-type transistor, as shown in FIG. 2.

The latch circuit 174 has terminals coupled to the data lines DL and DLB. Alternatively stated, the transmission gate 1731 is coupled between the bypass circuit 135 and one of the terminals of the latch circuit 174, and the transmission gate 1732 is coupled between the inverter 177 and another terminal of the latch circuit 174. For illustration, the latch circuit 174 includes P-type transistors P1-P2 coupled to a voltage terminal (e.g., providing the supply voltage VDDM and labeled VDDM hereinafter) and N-type transistor N1-N2 coupled to an N-type transistor N8. The transistor N8 is coupled to a supply voltage VSS (e.g., providing ground potential and labeled VSS hereinafter) and configured to operate in response to an enable signal SAE which is referred to as a periodic signal for enabling the sense amplifier 171. The transistors N1 and P1 form an inverter that is cross-coupled with an inverter formed by the transistors N2 and P2.

The precharge circuit 176 is coupled to the data lines DL and DLB. In some embodiments, during the test mode, the precharge circuit 176 is configured to be turned off in response to a precharge enable signal DLEQB having the high logic state when the enable signal SAE has the low logic state. Alternatively stated, the sense amplifier 171 is turned off when the precharge circuit 176 is off during the test mode. For illustration, the precharge circuit 176 includes P-type transistors P3-P5 having control terminal receiving the precharge enable signal DLEQB. Specifically, the transistor P3 is coupled between the data line DL and the voltage terminal VDDM, and the transistor P4 is coupled between the data line DLB and the voltage terminal VDDM. The transistor P5 is coupled between the data lines DL and DLB.

The output latch circuit 172 includes P-type transistors P6-P9, N-type transistors N3-N6, and a NAND gate 1721. In the embodiments of FIG. 2, the output latch circuit 172 further includes the inverter 175. For illustration, the transistor P6 is coupled between the voltage terminal VDDM and the transistor P7. The transistor P7 is coupled to the transistors N3, N5, P9, an input terminal of the inverter 175, and a first input terminal of the NAND gate 1721 at a node n1. The transistor N4 is coupled between the voltage terminal VSS and the transistor N3. The transistor P8 is coupled between the voltage terminal VDDM and the transistor P9. The transistor N6 is coupled between the voltage terminal VSS and the transistor N5. The transistors N4 and P6 have control terminals coupled to the data line DLB and are configured to operate in response to a data signal DS generated by the sense amplifier 171. The transistors P7 and N5 are configured to be switched in response to the enable signal SAEB. The transistors P9 and N3 are configured to be switched in response to the enable signal SAE, while the control terminal of the transistor N3 is coupled to the control terminal of the transistor N8. Control terminals of the transistors P8 and N6 are coupled to the output of the NAND gate 1721. The NAND gate 1721 receives an enable control signal PMB (having different logic state than the enable control signal PM).

In some embodiments, the memory device 10 further includes a P-type transistor P10 and an N-type transistor N7 that are coupled to the data line DL in order to balance capacitances of the data lines DL and DLB.

The memory device 10 further includes a clock generator 210 including inverters 211-212. In some embodiments, the inverter 211 is configured to generate a clock signal DCKB in response to a clock signal GLB_DCK, and the inverter 212 is configured to generate a clock signal DCK in response to the clock signal DCKB, in which the clock signals DCK and DCKB have different logic state.

The memory device 10 further includes an enable signal generator 220 including inverters 221-222, 224 and a NOR gate 223 coupled between the inverters 222 and 224. Specifically, the inverter 221 is configured to invert a signal GLB_SAE to generate the enable signal SAEB. The inverter 222 is configured to invert the enable signal SAEB to generate the enable signal SAE. The NOR gate 223 is configured to generate the enable signal D-SAEB based on the enable signal SAE and a test enable signal DFTB. In some embodiments, the test enable signal DFTB has the low logic state during the test mode and has the high logic state in other operational mode. The inverter 224 is configured to generate the enable signal D-SAE based on the enable signal D-SAE. In the test mode, the enable signal D-SAEB is referred to as a delayed signal with respect to the enable signal SAEB, and the enable signal D-SAE is referred to as a delayed signal with respect to the enable signal SAE.

The memory device 10 further includes a NOR gate 231 and inverters 232-233. The NOR gate 231 has a first input coupled to the output latch circuit 172 at a node n2 and a second input receiving the test enable signal DFTB. In some embodiments, the latch circuit 174 and the output latch circuit 172 are referred to as a read path D-flip flop. Accordingly, for a scan-based testing during the SHIFT mode of the test mode, a data output signal SQ generated by the output latch circuit 172 is transmitted through the NOR gate 231 and the inverters 232-233 as an input signal (e.g., the data signal SID of FIG. 1) to the DFT multiplexer 120 in the following memory device 10.

With reference to both FIGS. 1 and 2, the read mux circuit 180 includes transmission gates 181-182 configured to operate in response to control signals HIT and HITB that have different logic states. In some embodiments, the transmission gate 181 is coupled to the output latch circuit 172 at the node n2 and coupled to the output driver circuit 190, including a NOR gate 191, at a node n3. The NOR gate 191 has a first input receiving the signal from the transmission gate 181 and a second input receiving the enable control signal PM, and is configured to generate the output signal Q.

The configurations of FIG. 2 are given for illustrative purposes. Various implements are within the contemplated scope of the present disclosure. For example, as the embodiments in FIG. 3, the data signal SID or the data signal D and the write enable signal BWEB are transmitted to the bypass circuit 135 directly.

The detailed operational configurations of the memory device 10 in FIGS. 2-3 will be described in the following paragraphs with reference to both FIGS. 2-4. FIG. 4 illustrates waveforms of signals in the memory device 10 in FIGS. 1-3, in accordance with some embodiments of the present disclosure.

Figure 3:
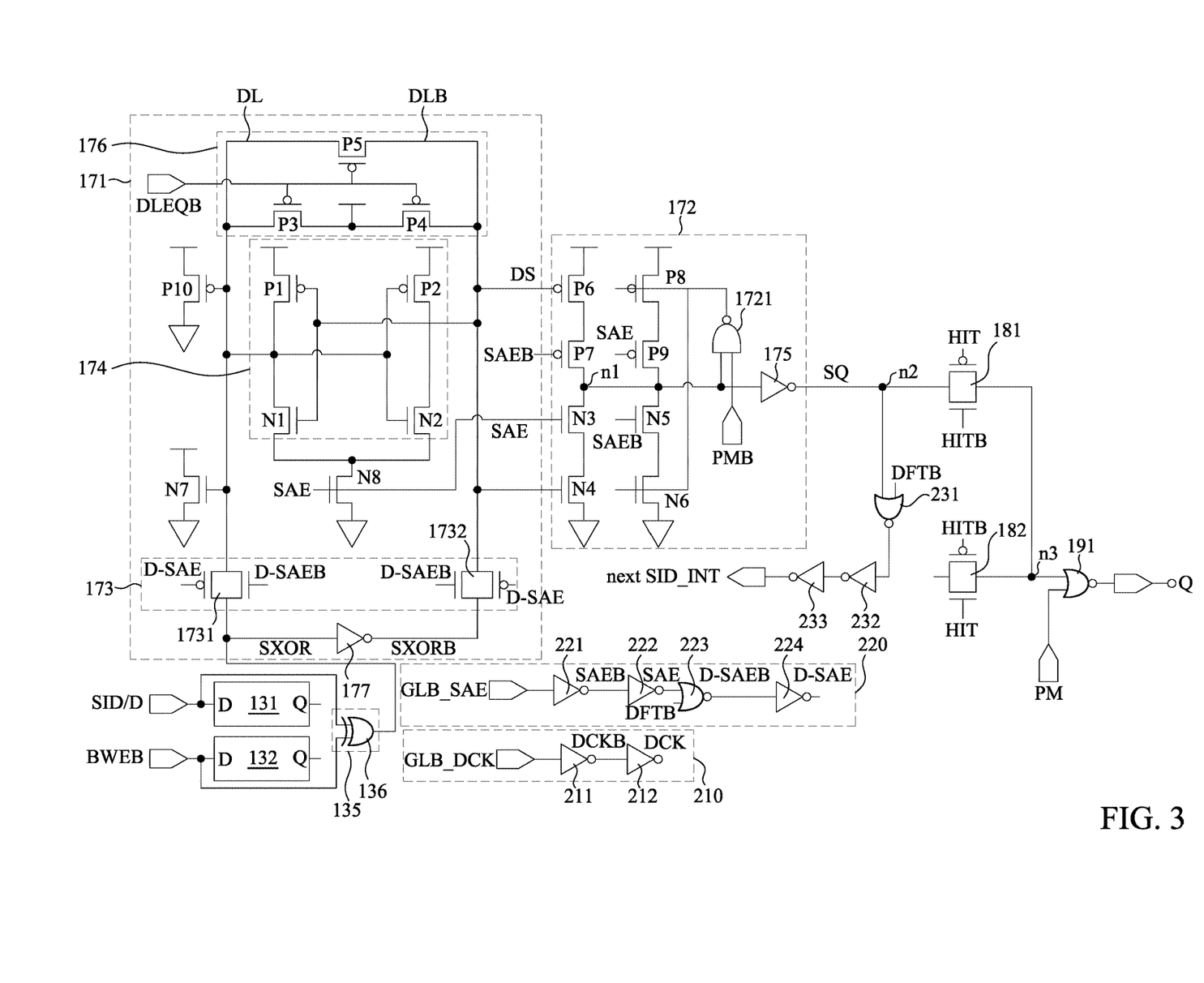
FIG. 3 is a detailed schematic diagram of the memory device of FIG. 1, in accordance with some embodiments of the present disclosure.
Figure 4:
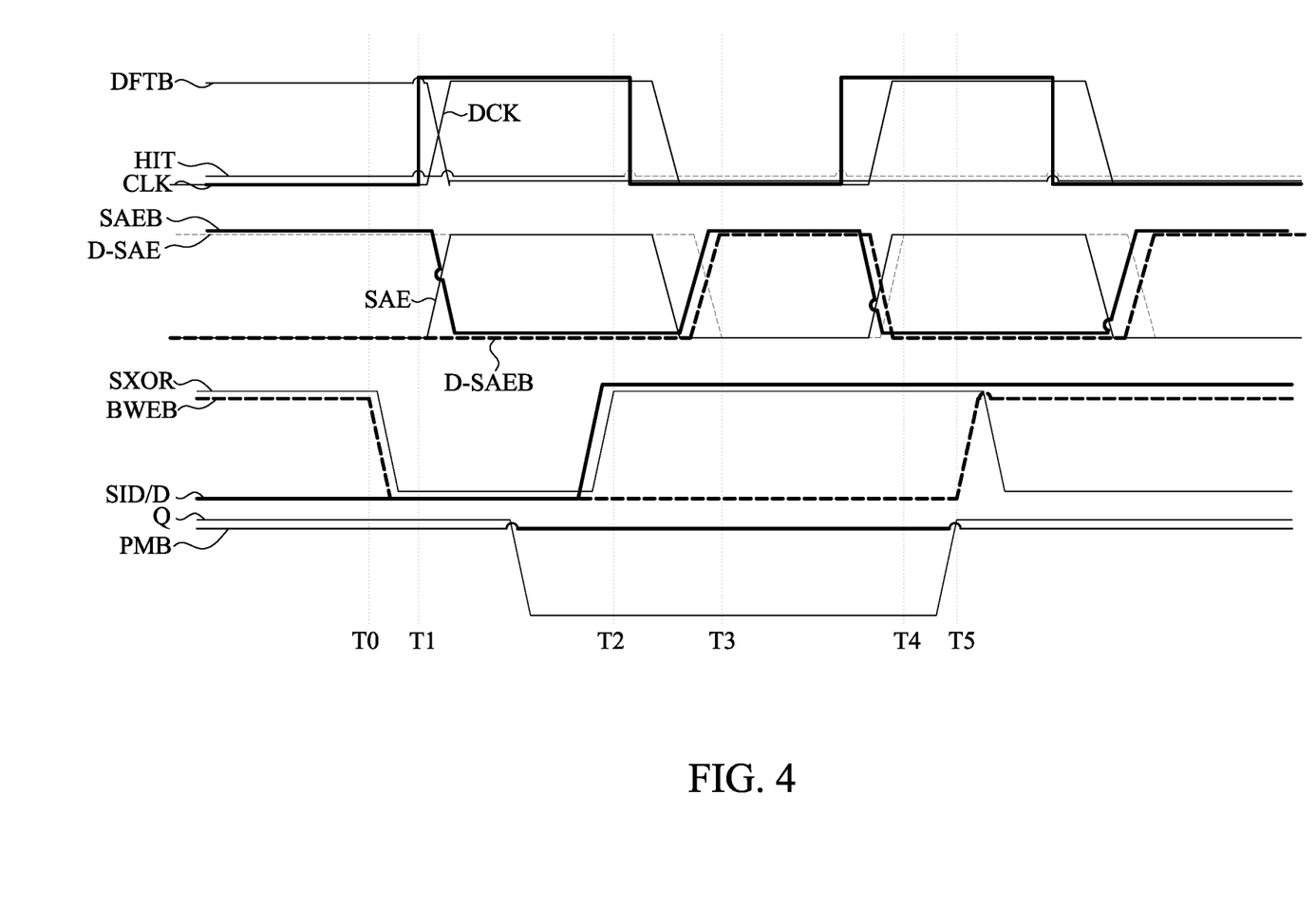
FIG. 4 illustrates waveforms of signals in the memory device in FIGS. 1-3, in accordance with some embodiments of the present disclosure.

In FIG. 3, at time T0, the write enable signal BWEB changes to the low logic state and accordingly the exclusive OR gate 136 generates the bypass data signal SXOR to have the low logic state when the data signal SID or the data signal D has the low logic state.

At time T1, as a global clock signal CLK for the memory device 10 goes high, the clock signal DCK, generated according to the clock signal CLK, rises and the test enable signal DFTB falls to have the low logic state. Alternatively, the memory device 10 starts operating in the (DFT) test mode. As shown in FIG. 4, the NOR gate 223 generates the enable signal D-SAEB having the low logic value in response to the enable signal SAE rising to have the high logic state and the test enable signal DFTB having the low logic. The inverter 224 inverted the enable signal D-SAEB to generate the enable signal D-SAE having the high logic state.

During time T1-T2, the data signal SID or the data signal D is inputted and rises to have the high logic state. The exclusive OR gate 136 generates and transmits the bypass data signal SXOR having the high logic state at time T2 to the sense amplifier 171 of the read circuit 170.

At time T3, in the test mode, the read gating circuit 173 is turned on to transmit the bypass data signal SXOR to the latch circuit 174, in response to the enable signal D-SAEB having the high logic state and the enable signal D-SAE having the low logic state, when the latch circuit 172 (e.g., referred to as a high-pass latch circuit) is turned off in response to the enable signal SAE having the low logic state and the enable signal SAEB having the high logic state.

Specifically, the bypass data signal SXOR having the high logic state is transmitted to the data line DL through the transmission gate 1731 and the bypass data signal SXORB having the low logic state is transmitted to the data line DLB through the transmission gate 1732. Accordingly, during the test mode, the sense amplifier 171 adjusts voltage levels of the data lines DL and DLB according to the bypass data signal SXOR, corresponding to the data signal SID or the data signal D, in response to the enable signal SAE having the low logic state and the enable signal D-SAEB having the high logic state. Alternatively stated, the latch circuit 174 in the sense amplifier 171 generates the data signal DS in the data line DLB to be transmitted to the output latch circuit 172. In some embodiments, in the read mode the enable signal SAE has the high logic state.

At time T4, the read circuit 170 generates the data output signal SQ corresponding to the data signal SID or the data signal D. Specifically, the high-pass output latch circuit 172 is turned on in response to the enable signal SAE rising to have the high logic state and the enable signal SAEB having the low logic state. Specifically, the transistor P6 is turned on in response to the data line DLB having a low voltage level corresponding to the bypass data signal SXORB, and transmits the supply voltage VDDM to the node n1 through the turned-on transistor P7 responsive to the enable signal SAEB. Accordingly, the output latch circuit 172 generates the data output signal SQ by the inverter 175 therein, in which the data output signal SQ has the low logic state.

At time T5, the transmission gate 181 transmits the data output signal SQ, in response to the control enable signal HIT having the low logic state and the control enable signal HITB having the high logic state, to the NOR gate 191. The NOR gate 191 generates the output signal Q having the high logic state in response to the enable control signal PM having the low logic state and the data output signal SQ having the low logic state. Accordingly, the output signal Q and the data signal SID or the data signal D have the same logic state. Alternatively stated, the data of the data signal SID or the data signal D is latched by the read circuit 170 and is transmitted to the output signal Q in the test mode.

In some approaches, a memory circuit usually implements a read-out sense amplifier and a data output latch circuit (e.g., Q-latch) in the read mode (of NORMAL mode) and D flip-flop circuit accompanying shadow latches in the (DFT) test mode for scan capture or data shift operation. Accordingly, elements, such like the shadow latch, 3-to-1 multiplexers, programing circuits and power clamping in every input/output induce significant area penalty and consume certain active power, and in some arrangements, standby leakage occurs in the elements and connections.

With the configurations of the present application, the sense amplifier, reading out data from memory cells in the read mode, and the data output latch circuit, latching the read data temporarily for further operations, are configured to scan capture or shift test data in the test mode, which achieves area and power saving as no extra D flip-flop circuit, shadow latches, and/or other associated logic circuit are necessary to be equipped. Furthermore, based on the reasons above, leakage in the memory device is remedied along with reduced number of circuits and logic gates.

Figure 5:
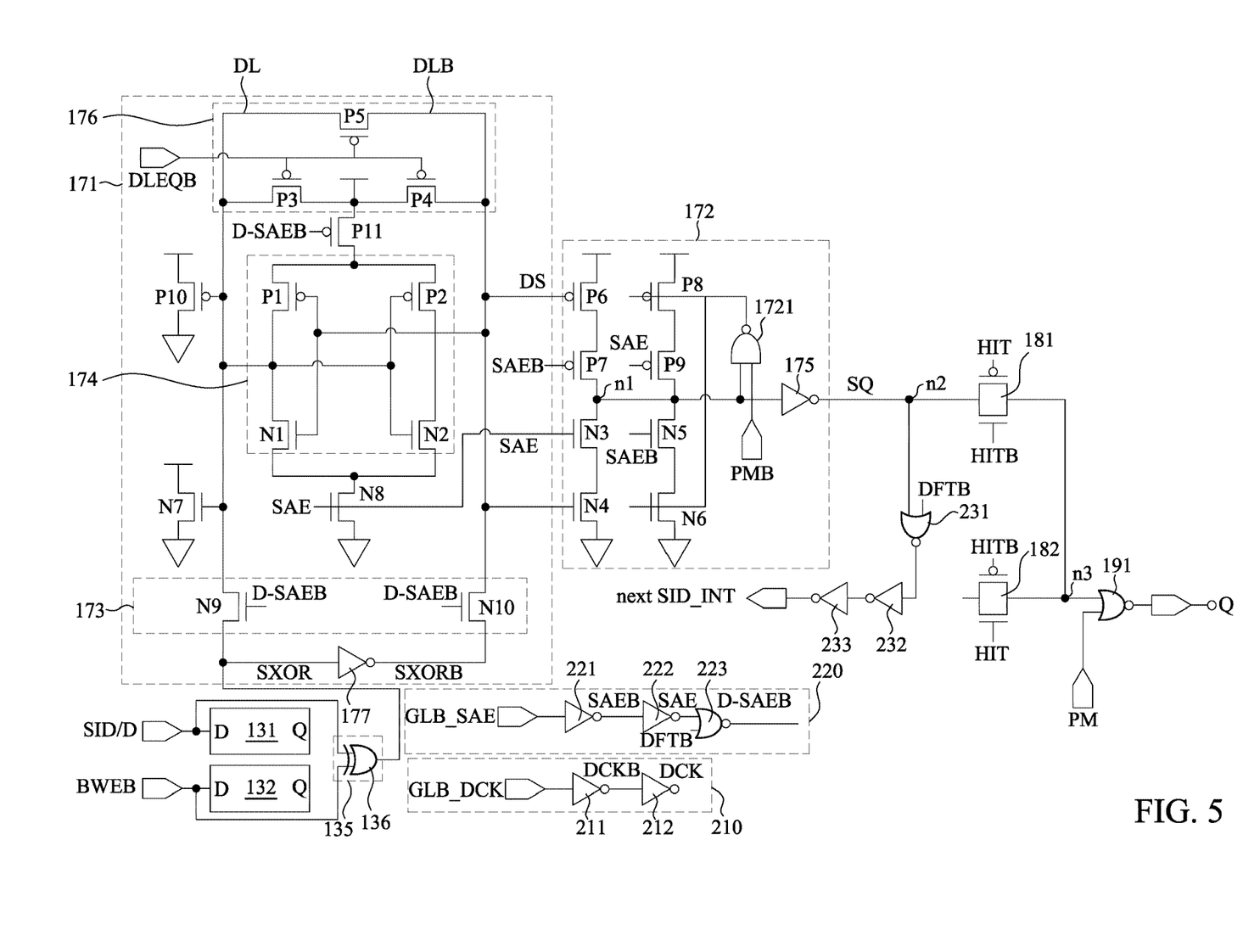
FIG. 5 is a detailed schematic diagram of the memory device of FIG. 1, in accordance with some embodiments of the present disclosure.

Reference is now made to FIG. 5. FIG. 5 is a detailed schematic diagram of the memory device 10 of FIG. 1, in accordance with some embodiments of the present disclosure. With respect to the embodiments of FIGS. 1-4, like elements in FIG. 5 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5.

Compared with FIG. 3, instead of having the transmission gates 1731-1732 to transmit the bypass data signals SXOR and SXORB, the read gating circuit 173 in FIG. 5 includes N-type transistors N9-N10. For illustration, the transistor N9 is coupled to the data line DL and configured to be turned on in response to the enable signal D-SAEB to transmit the bypass data signal SXOR to the data line DL. The transistor N10 is coupled to the data line DLB and configured to be turned on in response to the enable signal D-SAEB to transmit the bypass data signal SXORB to the data line DLB.

Furthermore, the sense amplifier 171 includes a P-type transistor P11 coupled between the precharge circuit 176 and the latch circuit 174. Specifically, the transistor P11 has a first terminal coupled between the transistors P3-P4 at the voltage terminal VDDM and a second terminal coupled between the transistors P1-P2.

In operation of the test mode, the transistor P11 is turned off to prevent the data lines DL and DLB being influenced by other signals in the memory device 10. Alternatively stated, the voltage levels of the data lines DL and DLB are modulated merely based on the bypass data signal SXOR and SXORB.

The configurations of FIG. 2-5 are given for illustrative purposes. Various implements are within the contemplated scope of the present disclosure. For example, in some embodiments, the inputted data signal SID or the data signal D during the test mode has the low logic state, the output signal Q is correspondingly to have the low logic state with the configurations of the present application.

Figure 6:
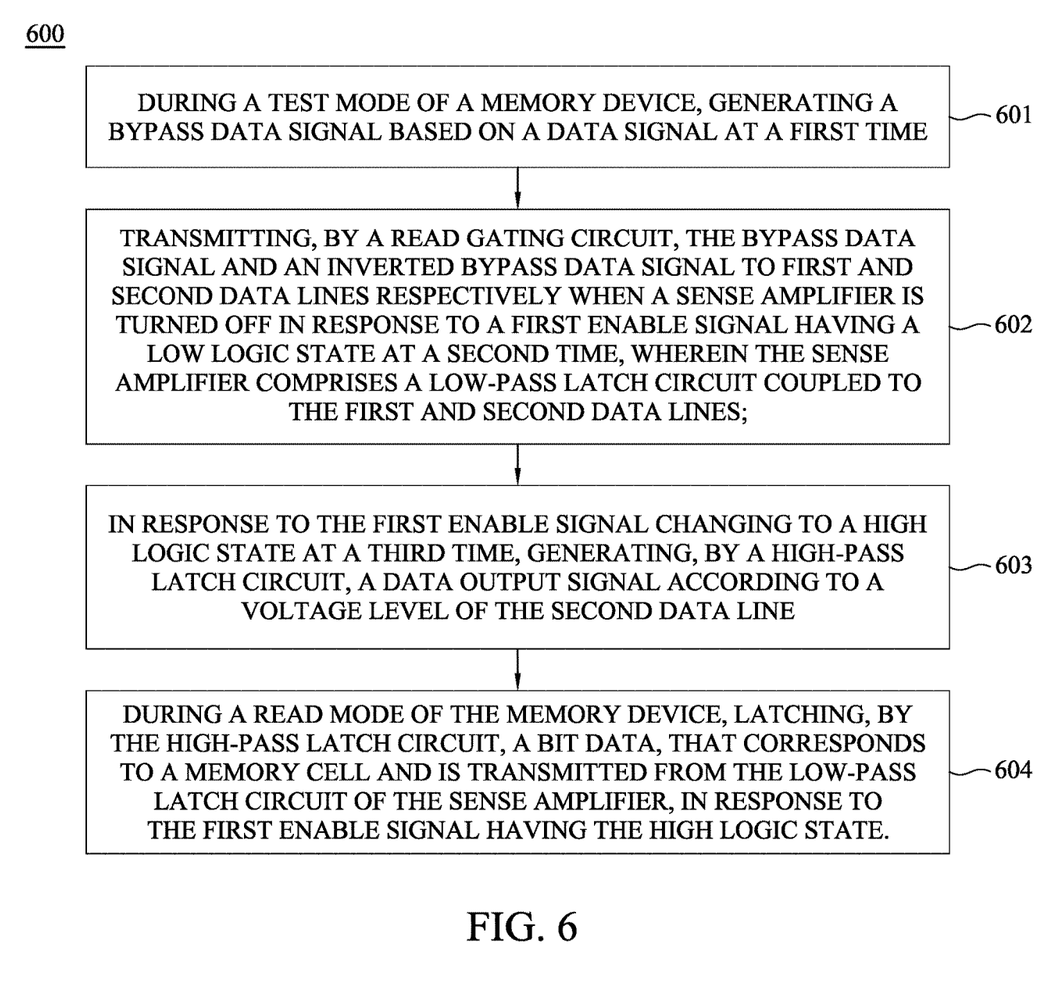
FIG. 6 is a flowchart of a method for operating a memory device, in accordance with some embodiments of the present disclosure.

Reference is now made to FIG. 6. FIG. 6 is a flowchart of a method 600 for operating a memory device, in accordance with some embodiments of the present disclosure. It is understood that additional operations/stages can be provided before, during, and after the processes shown by FIG. 6, and some of the operations/stages described below can be replaced or eliminated, for additional embodiments of the method 600. The method 600 includes operations 601-604 and will be discussed in the following paragraphs with reference to FIGS. 1-5.

In operation 601, during the test mode of the memory device 10 corresponding to FIGS. 1-3, the bypass data signal SXOR is generated based on the data signal SID or the data signal D at time T2.

In some embodiments, the method 600 further includes operations of generating, based on the enable signal SAE and the test enable signal DFTB, the enable signal D-SAEB to turn on the read gating circuit 173. The test enable signal DFTB has the high logic state in the read mode and the low logic state in the test mode of the memory device 10.

In operation 602, the bypass data signals SXOR and SXORB are transmitted by the read gating circuit 173 to the data lines DL and DLB respectively when the sense amplifier 171 is turned off in response to the enable signal SAE having the low logic state at time T3. In some embodiments, transmitting the bypass data signals SXOR and SXORB includes the operations of turning on the read gating circuit 173 in response to the enable signal D-SAEB, generated based on the enable signal SAE, and the enable signal D-SAE generated from inverting the enable signal D-SAEB.

Moreover, the method 600 further includes operations of turning off the latch circuit 172 before turning on the read gating circuit 173. Specifically, as shown in FIG. 4, the output latch circuit 172 is turned off in response to the enable signal SAE falls during times T2 to T3, and the read gating circuit 173 is turned on in response to the enable signal D-SAE falling and the enable signal D-SAEB rising during times T3 to T4.

In operation 603, the output latch circuit 172 generates the data output signal SQ according to the voltage level of the data line DLB in response to the enable signal SAE changing to the high logic state at time T4.

In operation 604, during the read mode of the memory device 10, a bit data, that corresponds to a memory cell in the memory array 100 and is transmitted from the latch circuit 174 of the sense amplifier 171, is latched by the latch circuit 172 in response to the enable signal SAE having the high logic state.

As described above, the (DFT) device in the present disclosure provides configurations of scan capturing and shifting test data through the sense amplifier and the data output latch circuit that are also configured to read and output data from the memory array. By removing non-read mode D-flip flop circuit and other related logic circuit, optimizations of area and power in the device is provided.

In some embodiments, a device is provided and includes a sense amplifier and an output latch circuit. The sense amplifier adjusts voltage levels of first and second data lines according to a bypass data signal corresponding to a data signal in response to a first enable signal having a first logic state and a second enable signal having a second logic state different from the first logic state during a test mode. The output latch circuit generates a data output signal according to the voltage level of the first data line in response to the first enable signal having the second logic state and a third enable signal having the first logic state during the test mode. In some embodiments, the sense amplifier comprises a first inverter configured to inverter the bypass data signal to generate an inverted bypass data signal; a first transmission gate configured to transmit the inverted bypass data signal to the first data line in response to the second enable signal and a fourth enable signal inverted from the second enable signal; and a second transmission gate configured to transmit the bypass data signal to the second data line in response to the second and third enable signal. In some embodiments, the device further includes an enable signal generator, comprising a NOR gate configured to generate the second enable signal based on the first enable signal and a test enable signal; and a second inverter configured to generate the fourth enable signal based on the second enable signal. In some embodiments, the sense amplifier comprises a first transistor configured to be turned on in response to the second enable signal to transmit an inverted bypass data signal, according to the bypassed data signal, to the first data line; a second transistor configured to be turned on in response to the second enable signal to transmit the bypass data signal to the second data line; a latch circuit coupled between the first and second data lines; a third transistor coupled between the latch circuit and a precharge circuit; and a fourth transistor coupled between the latch circuit and a supply voltage terminal and configured to be turned on in response to the first enable signal. In some embodiments, the device further includes an enable signal generator configured to generate the second enable signal based on the first enable signal and a test enable signal. In some embodiments, the first, second, and fourth transistors are of N conductivity type, and the third transistor is of P conductivity type. In some embodiments, the device further includes a bypass circuit comprising an exclusive OR gate configured to generate the bypass data signal according to the data signal and a write enable signal. In some embodiments, the device further includes a first low-pass latch circuit and a second low-pass latch circuit, wherein during the test mode the first and second low-pass latch circuits are configured to transmit signals corresponding to the data signal and the write enable signal, respectively, to the bypass circuit. In some embodiments, the sense amplifier comprises a precharge circuit coupled to the first and second data lines, wherein during the test mode, the precharge circuit is configured to be turned off in response to a precharge enable signal having the second logic state when the first enable signal has the first logic state.

Also disclosed is a device that includes a write circuit and a read circuit that are coupled to first and second bit lines through a write column select circuit and a read column select circuit; a design for testability (DFT) multiplexer configured to transmit a write data signal to the write circuit in a write mode; and a bypass circuit coupled between the read circuit and the DFT multiplexer. The DFT multiplexer is further configured to transmit a first data signal to the bypass circuit in a test mode, and the read circuit is configured to generate a data output signal corresponding to the first data signal. In some embodiments, the device further includes a write latch circuit coupled between the DFT multiplexer and the bypass circuit, and configured to output the first data signal received from the DFT multiplexer to the bypass circuit. The bypass circuit is configured to generate, according to the first data signal and a write enable signal, a bypass data signal to the read circuit. In some embodiments, the read circuit comprises a high-pass latch circuit; and a sense amplifier comprising a low-pass latch circuit configured to generate a second data signal according to the bypass data signal received from the bypass circuit to the high-pass latch circuit. The high-pass latch circuit is configured to generate the data output signal. In some embodiments, the device further includes an enable signal generator configured to generate a first enable signal based on a second enable signal and a test enable signal. The read circuit further comprises a read gating circuit configured to transmit the bypass data signal to the low-pass latch circuit in response to the first enable signal having a high logic state when the high-pass latch circuit is turned off in response to the second enable signal having a low logic state in the test mode. The second enable signal has the high logic state in a read mode.

In some embodiments, the read circuit comprises a sense amplifier comprising a first latch circuit; and a read gating circuit configured to be turned on to transmit a bypass data signal received from the bypass circuit to the first latch circuit in response to first and second enable signals. The read circuit further comprises a second latch circuit coupled to a first terminal of the first latch circuit, and configured to output the data output signal in response to third and fourth enable signals. In the test mode the first and fourth enable signals have a first logic state, and the second and third enable signals have a second logic state different from the first logic state. In some embodiments, the sense amplifier further comprises an inverter having a first terminal coupled to the bypass circuit. The read gating circuit comprises a first transmission gate coupled between the inverter and the first terminal of the first latch circuit; and a second transmission gate coupled between the bypass circuit and a second terminal of the first latch circuit. In some embodiments, the device further includes a NOR gate configured to generate the first enable signal based on the third enable signal and a test enable signal. The read gating circuit is turned on in the test mode, the test enable signal has a low logic state and the first logic state is a high logic state.

Also disclosed is a method includes operations: during a test mode of a memory device, generating a bypass data signal based on a data signal at a first time; transmitting, by a read gating circuit, the bypass data signal and an inverted bypass data signal to first and second data lines respectively when a sense amplifier is turned off in response to a first enable signal having a low logic state at a second time, wherein the sense amplifier comprises a low-pass latch circuit coupled to the first and second data lines; in response to the first enable signal changing to a high logic state at a third time, generating, by a high-pass latch circuit, a data output signal according to a voltage level of the second data line; and during a read mode of the memory device, latching, by the high-pass latch circuit, a bit data, that corresponds to a memory cell and is transmitted from the low-pass latch circuit of the sense amplifier, in response to the first enable signal having the high logic state. In some embodiments, the method further includes operations of generating, based on the first enable signal and a test enable signal, a second enable signal to turn on the read gating circuit. The test enable signal has the high logic state in the read mode and the low logic state in the test mode. In some embodiments, transmitting the bypass data signal and the inverted bypass data signal comprises turning on the read gating circuit in response to a second enable signal, generated based on the first enable signal, and a third enable signal generated from inverting the second enable signal. In some embodiments, the method further includes operations of turning off the high-pass latch circuit before turning on the read gating circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a write circuit and a read circuit that are coupled to first and second bit lines through a write column select circuit and a read column select circuit;
   a design for testability (DFT) multiplexer configured to transmit a write data signal to the write circuit in a write mode; and
   a bypass circuit coupled between the read circuit and the DFT multiplexer,
   wherein the DFT multiplexer is further configured to transmit a first data signal to the bypass circuit in a test mode,
   wherein the bypass circuit is configured to generate a bypass data signal according to the first data signal,
   wherein the read circuit comprises a sense amplifier configured to receive the bypass data signal, and
   the read circuit is configured to generate a data output signal corresponding to the first data signal.

2. The device of claim 1, further comprising:
   a write latch circuit coupled between the DFT multiplexer and the bypass circuit, and configured to output the first data signal received from the DFT multiplexer to the bypass circuit,
   wherein the bypass circuit is further configured to generate, according to the first data signal and a write enable signal, the bypass data signal to the sense amplifier.

3. The device of claim 2, wherein the read circuit comprises a high-pass latch circuit,
   wherein the sense amplifier comprises a low-pass latch circuit configured to generate a second data signal according to the bypass data signal received from the bypass circuit to the high-pass latch circuit,
   wherein the high-pass latch circuit is configured to generate the data output signal.

4. The device of claim 3, further comprising:
   an enable signal generator configured to generate a first enable signal based on a second enable signal and a test enable signal, wherein the read circuit further comprises:
   a read gating circuit configured to transmit the bypass data signal to the low-pass latch circuit in response to the first enable signal having a high logic state when the high-pass latch circuit is turned off in response to the second enable signal having a low logic state in the test mode,
   wherein the second enable signal has the high logic state in a read mode.

5. The device of claim 1, wherein the read circuit a sense amplifier comprises:
   a first latch circuit; and
   a read gating circuit configured to be turned on to transmit a bypass data signal received from the bypass circuit to the first latch circuit in response to first and second enable signals,
   wherein the read circuit further comprises:
   a second latch circuit coupled to a first terminal of the first latch circuit, and configured to output the data output signal in response to third and fourth enable signals,
   wherein in the test mode the first and fourth enable signals have a first logic state, and the second and third enable signals have a second logic state different from the first logic state.

6. The device of claim 5, wherein the sense amplifier further comprises:
   an inverter having a first terminal coupled to the bypass circuit,
   wherein the read gating circuit comprises:
   a first transmission gate coupled between the inverter and the first terminal of the first latch circuit; and
   a second transmission gate coupled between the bypass circuit and a second terminal of the first latch circuit.

7. The device of claim 5, further comprising:
   a NOR gate configured to generate the first enable signal based on the third enable signal and a test enable signal,
   wherein the read gating circuit is turned on in the test mode, the test enable signal has a low logic state and the first logic state is a high logic state.

8. A device, comprising:
   a write circuit and a read circuit that are coupled to first and second bit lines through a write column select circuit and a read column select circuit;
   a design for testability (DFT) multiplexer configured to transmit a write data signal to the write circuit in a write mode; and
   a bypass circuit coupled between the read circuit and the DFT multiplexer,
   wherein the DFT multiplexer is further configured to transmit a first data signal to the bypass circuit in a test mode, wherein the read circuit is configured to generate, in response to a first enable signal having a first logic state and a second enable signal having a second logic state different from the first logic state during the test mode, a data output signal according to a bypass data signal that is corresponding to the first data signal, wherein the read circuit is further configured to generate the data output signal according to a voltage level of a first data line in response to the first enable signal having the second logic state and a third enable signal having the first logic state during the test mode.

9. The device of claim 8, wherein the read circuit comprises:
a sense amplifier configured to adjust voltage levels of the first data line and a second data line according to the bypass data signal corresponding to the first data signal; and
an output latch circuit configured to generate the data output signal according to the voltage level of the first data line in response to the first enable signal having the second logic state and the third enable signal having the first logic state during the test mode.

10. The device of claim 9, wherein the sense amplifier comprises:
a first inverter configured to invert the bypass data signal to generate an inverted bypass data signal;
a first transmission gate configured to transmit the inverted bypass data signal to the first data line in response to the second enable signal and a fourth enable signal inverted from the second enable signal; and
a second transmission gate configured to transmit the bypass data signal to the second data line in response to the second and third enable signals.

11. The device of claim 10, further comprising:
an enable signal generator, comprising:
a NOR gate configured to generate the second enable signal based on the first enable signal and a test enable signal; and
a second inverter configured to generate the fourth enable signal based on the second enable signal.

12. The device of claim 9, wherein the sense amplifier comprises:
a first transistor configured to be turned on in response to the second enable signal to transmit an inverted bypass data signal, according to the bypassed data signal, to the first data line;
a second transistor configured to be turned on in response to the second enable signal to transmit the bypass data signal to the second data line;
a latch circuit coupled between the first and second data lines;
a third transistor coupled between the latch circuit and a precharge circuit; and
a fourth transistor coupled between the latch circuit and a supply voltage terminal and configured to be turned on in response to the first enable signal.

13. The device of claim 12, wherein the first transistor, the second transistor, and the fourth transistor are of N conductivity type, and
the third transistor is of P conductivity type.

14. The device of claim 9, further comprising:
an enable signal generator configured to generate the second enable signal based on the first enable signal and a test enable signal.

15. The device of claim 9, wherein the sense amplifier comprises:
a precharge circuit coupled to the first and second data lines, wherein during the test mode, the precharge circuit is configured to be turned off in response to a precharge enable signal having the second logic state when the first enable signal has the first logic state.

16. The device of claim 8, wherein the bypass circuit comprises:
an exclusive OR gate configured to generate the bypass data signal according to the first data signal and a write enable signal.

17. A device, comprising:
a write circuit and a read circuit that are coupled to first and second bit lines through a write column select circuit and a read column select circuit;
a design for testability (DFT) multiplexer configured to transmit a write data signal to the write circuit in a write mode, and generate a first data signal in a test mode; and
a bypass circuit configured to generate a bypass data signal in response to the first data signal in the test mode,
wherein the read circuit comprises a sense amplifier configured to receive the bypass data signal,
wherein the read circuit is configured to generate a data output signal according to the bypass data signal.

18. The device of claim 17, wherein the bypass circuit comprises:
an exclusive OR gate configured to generate the bypass data signal according to the first data signal and a write enable signal; and
a first low-pass latch circuit and a second low-pass latch circuit, wherein during the test mode the first and second low-pass latch circuits are configured to transmit signals corresponding to the first data signal and the write enable signal, respectively, to the bypass circuit.

19. The device of claim 17, wherein the read circuit comprises a high-pass latch circuit,
wherein the sense amplifier comprises a low-pass latch circuit configured to generate a second data signal according to the bypass data signal received from the bypass circuit to the high-pass latch circuit,
wherein the high-pass latch circuit is configured to generate the data output signal.

20. The device of claim 19, wherein the high-pass latch circuit is configured to latch a bit data transmitted from the low-pass latch circuit during a read mode.

* * * * *